(12) United States Patent
Liberkowsky

(10) Patent No.: US 9,748,269 B1
(45) Date of Patent: Aug. 29, 2017

(54) FUSE PROGRAMMABLE LOGIC CIRCUITRY WITH MULTIPLE TRANSISTOR PILLARS

(71) Applicant: Janusz Liberkowsky, Los Gatos, CA (US)

(72) Inventor: Janusz Liberkowsky, Los Gatos, CA (US)

( * ) Notice: Subject to any disclaimer, the term of this patent is extended or adjusted under 35 U.S.C. 154(b) by 0 days.

(21) Appl. No.: 14/494,735

(22) Filed: Sep. 24, 2014

(51) Int. Cl.
| H01L 27/118 | (2006.01) |
| H01L 27/06 | (2006.01) |
| H01L 23/525 | (2006.01) |
| H01L 29/78 | (2006.01) |
| H01L 27/088 | (2006.01) |

(52) U.S. Cl.
CPC .... *H01L 27/11803* (2013.01); *H01L 23/5256* (2013.01); *H01L 27/0688* (2013.01); *H01L 27/088* (2013.01); *H01L 29/7827* (2013.01)

(58) Field of Classification Search
CPC ........... H01L 27/11803; H01L 23/5256; H01L 29/7827; H01L 27/0688; H01L 27/088; H01L 27/11206; H01L 27/1128
See application file for complete search history.

(56) References Cited

U.S. PATENT DOCUMENTS

| 5,623,160 | A | 4/1997 | Liberkowski |
| 5,691,209 | A | 11/1997 | Liberkowski |
| 6,506,981 | B1 | 1/2003 | Liberkowski |
| 2010/0270593 | A1* | 10/2010 | Lung ..................... H01L 27/101 257/208 |

* cited by examiner

*Primary Examiner* — Tucker J Wright

(57) ABSTRACT

Transistor pillars have multiple transistor stacks of drain, source and gate rings. Layer fuses connect the rings to conductive layers surrounding the transistor pillars. In between individual transistor stacks are core fuses positioned along the transistor core columns. In one embodiment, layer fuses are fused prior to the core fuses. In a second embodiment, the core fuses may be fuse programmable separated by fusing currents applied preferably via top and bottom stripe layers immediately above and below the core fuses. A core fuse set current applied to predetermined core fuses via individual stripes above and below thermally disintegrates the core fuses. By selectively disintegrating core fuses independently from disintegrating layer fuses, a three dimensional logic circuitry architecture may be fuse programmed into a homogeneous original manufactured transistor pillar structure.

8 Claims, 7 Drawing Sheets

FUSE PROGRAMMABLE LOGIC CIRCUITRY WITH MULTIPLE TRANSISTOR PILLARS

FIELD OF INVENTION

The present invention relates to logic circuitry including pillars of stacked transistors. In particular, the present invention relates to fuse programmable logic circuitry including pillars of discrete and concentrically structured transistors.

BACKGROUND OF INVENTION

Ever increasing demand for computing power raises the need on one hand for more densely fabricated logic circuitry and on the other hand for more flexibility in fabricating the circuitry's operational architecture. In the U.S. Pat. Nos. 5,623,160, 5,691,209 & 6,506,981 all of the same as this inventor, densely arrayed conductive pillars with selectable connect able and disconnect able horizontal conductive leads are described and claimed to provide a well known Multi Chip Module (MCM) configuration for dense and fuse programmable three dimensional conductive connections within the MCM. It would be desirable to have such MCM configuration similarly inventively extended to make suitable similar to well known Field Programmable Gate Arrays (FPGA) but with its logic circuitry highly dense three dimensionally fabricated and three dimensionally fuse programmable. The present invention addresses this need.

Concentrically structured transistors have gained increasing attention for their switching efficiency and small footprint. Nevertheless, in order to extend logic circuitry from planar into full three dimensional architectures, there exists a need to provide transistor pillars of stacked multiple discrete transistors. The present invention addresses also this need.

SUMMARY

A number of transistor pillars have along their height multiple transistor access stacks of drain and source rings that are conductively encompassing the transistor core column. in between each set of drain and source layer are one or more gate rings surrounding the core column in a gating effective fashion as is well known for concentric transistor architectures. Radially outward the drain and source rings as well as the gate rings are layer fuses connecting the rings to conductive layers that extend around and away from the transistor pillar array. The layer fuses are configured to disintegrate above a predetermined layer fuse set current. Access for programming the layer fuses may be done by conductor/insulator stair steps at lateral boundaries of multiple stacked layers and pillars within.

In between individual transistor access stacks are core fuses positioned along the transistor core columns. In a first embodiment, the core fuses are configured to disintegrate above a predetermined core fuse set current, which is preferably substantially above a layer fuse set current. In a programming sequence employed after manufacturing and prior to operation of the logic circuitry of the present invention, first the layer fuses may be selectively disintegrated whereby a three dimensional interconnection pattern is formed. Once the layer fuses are fuse programmed, the individual transistor stacks may be separated by two angularly oriented conductive stripe layers immediately above and below the core fuses. The core fuse set current may be directed to predetermined core fuses across individual stripes of the stripe layers. By selectively disintegrating a number of core fuses within the three dimensional core fuse grit, a three dimensional logic circuitry architecture may be fuse programmed into a homogeneously original manufactured multiple transistor pillar structure without affecting the layer fuses. Once the individual transistors are defined within the transistor pillars, the layer fuses may also be selectively disintegrated thereby completing the hard programming of the predetermined three dimensional logic circuitry architecture. For that purpose, the stripe layers may also be employed within the previously separated transistor stacks.

Further part of the original manufactured transistor pillar structure may also be interconnect columns that may also feature core and layer fuses to selectively establish three dimensional conductive paths for the transistors in a similar dual step fuse programming.

BRIEF DESCRIPTION OF THE FIGURES

FIG. 2DET is a detailed view of FIG. 2 as indicated there.

FIG. 3DET is a detailed view of FIG. 3 as indicated there.

FIG. 4DET is a detailed view of FIG. 3 as indicated there.

DETAILED DESCRIPTION

Figure 1:
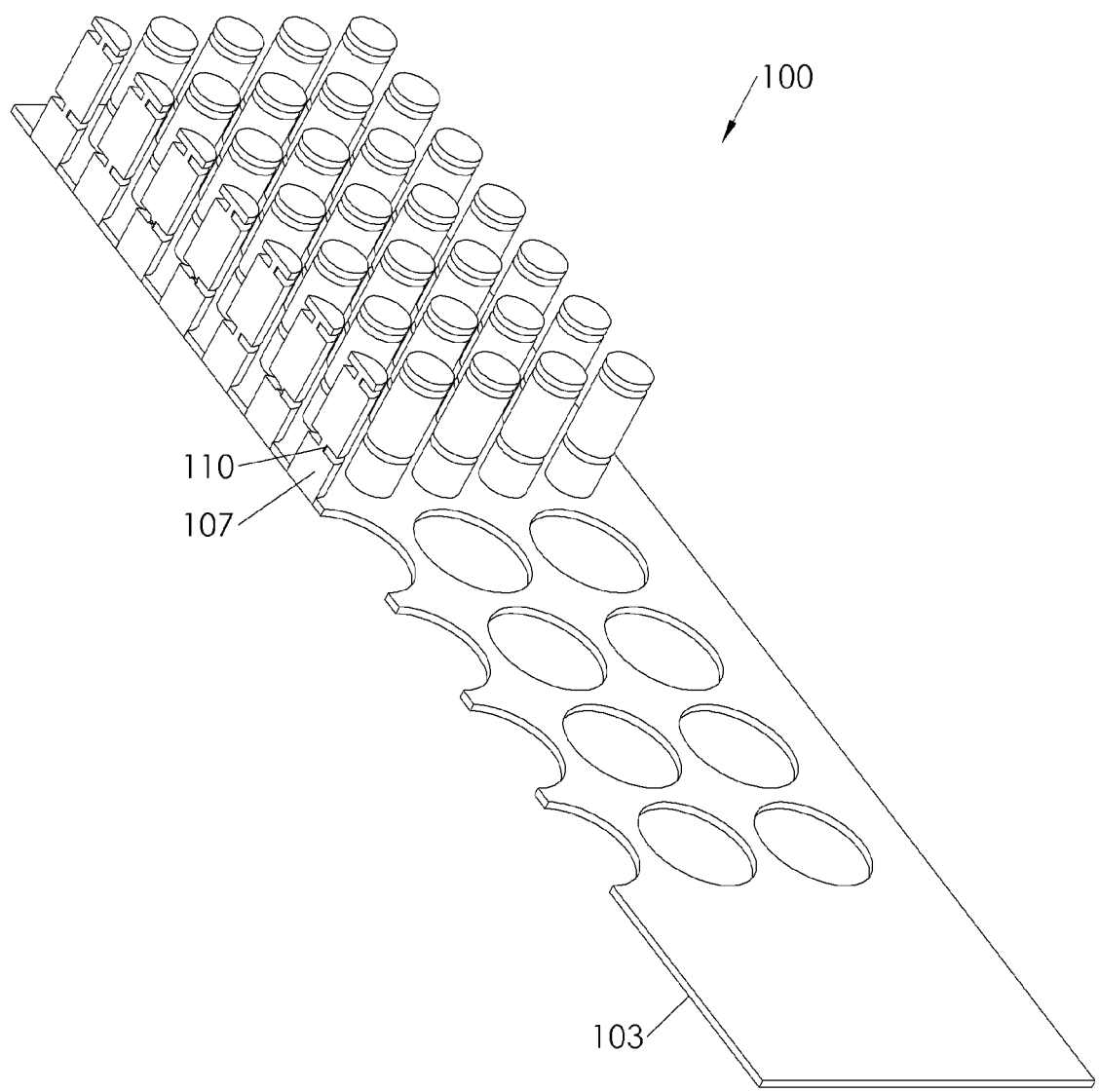
FIG. 1 is a perspective view depicting a base substrate and a transistor core column array of a first embodiment of the invention.
Figure 2:
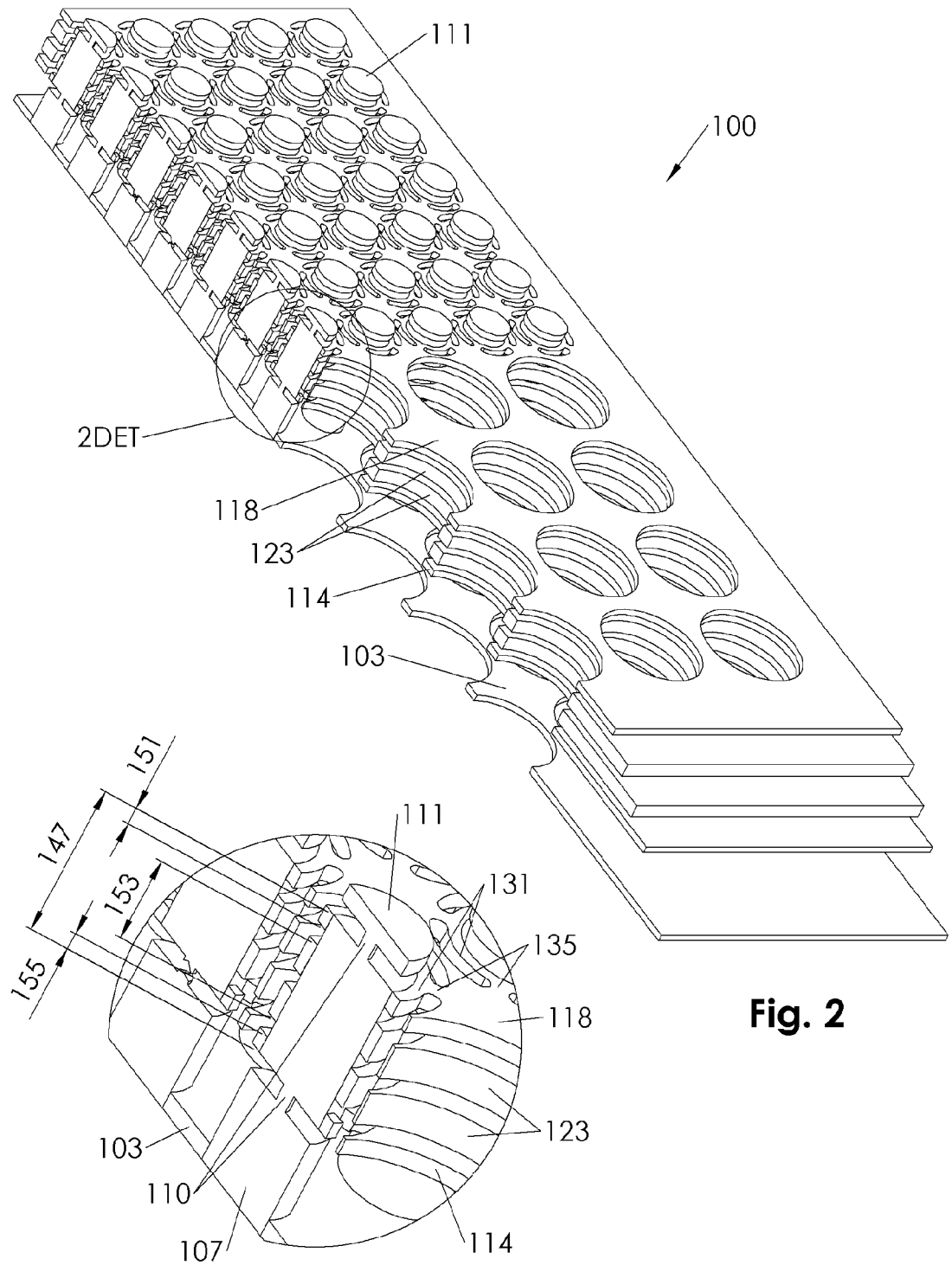
FIG. 2 is the perspective view of the first embodiment of the invention further depicting drain, source and gating layers of a first transistor stack height.
Figure 3:
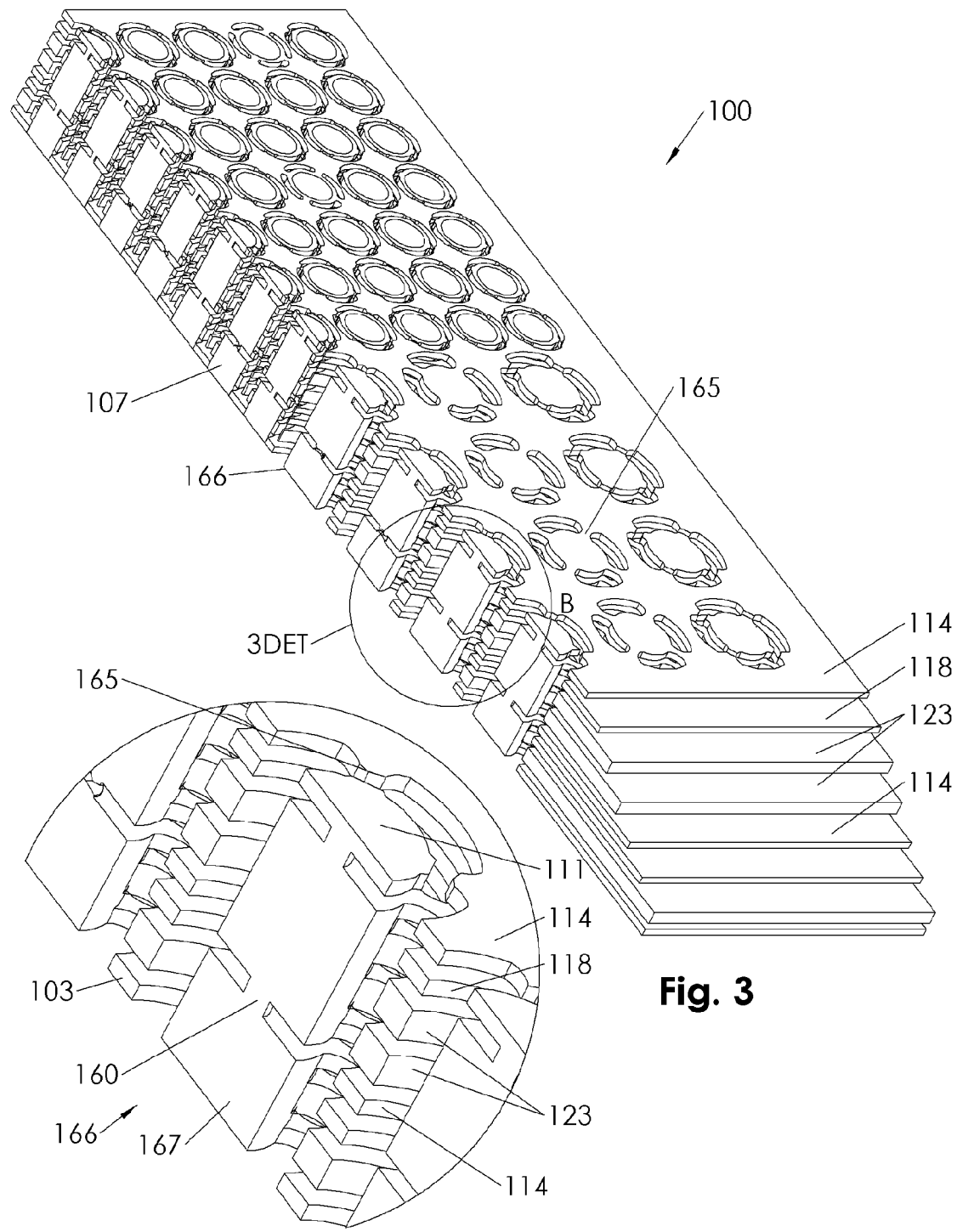
FIG. 3 is the perspective view of the first embodiment of the invention further depicting drain, source and gating layers of a second transistor stack height.
Figure 4:
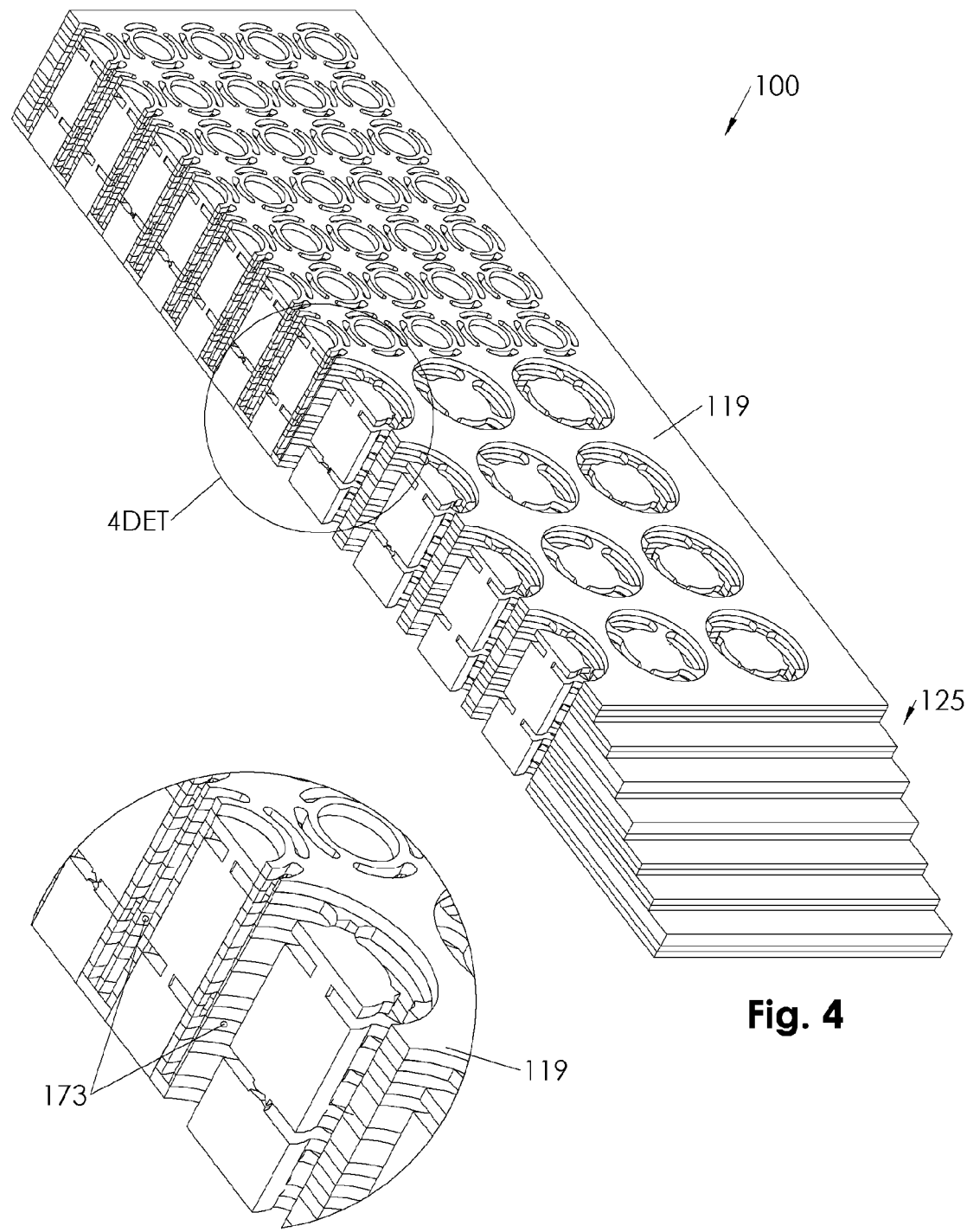
FIG. 4 is the perspective view of the first embodiment of the invention further depicting dielectric layers.

A transistor pillar logic circuitry 100 of a first embodiment of the invention depicted in FIGS. 1-4 includes a preferably two dimensionally array of semiconductor core columns 107, at least two transistor stacks 147 and core column fuses 110. Each transistor stack 147 features a source layer 114, a drain layer 118 and one or more gate layers 123. The source layer 114 is conductively encompassing a first through portion 151 of the semiconductor core column 107. The drain layer 118 is conductively encompassing a second through portion 155 of the semiconductor core column 107. The gate layer(s) 123 is/are conductively encompassing a third through portion 153 of the semiconductor core column 107. The third through portion 153 is in between first and second through portions 151, 155 such that a first voltage applied in between the source and drain layers 114, 118 within a single transistor stack 147 results in a current flow radially from the source layer 114 onto the semiconductor core column 107 and radially from the semiconductor core column 107 onto the drain layer 118 while a voltage is switched at the gate layer(s) 123 as is well known for transistor function.

At least one but preferably each of the source, drain and gate layers 114, 118, 123 features layer fuses 135 that conductively connect respective column rings 131 with their peripheral conductors that are both of and within their respective drain, source and/or gate layers, 114, 118, 123. Via the peripheral conductors, current and/or voltage is passed between the logic circuitry's 100 periphery and the column rings 135 across intact layer fuses 135. Along a peripheral edge of the logic circuitry 100 may be stair stepped layer terminals 125 to conveniently access the individual layers 114, 118, 123 with further well known conductive elements. Preferably a number of layer fuses 135 are circumferentially arrayed around the respective column rings 131. Venting slots 173 extend across the source, drain and gate layers 114, 118, 123 in an offset to the semiconductor core column 107 and adjacent the respective column rings 131 and layer fuses 135 such that fumes from evaporating the layer fuses 135 are vented off through the venting slots 173.

All layer fuses 135 connecting to a single column ring 131 may be configured with a layer fuse peak current and the core column fuses 110 may be configured with a core fuse peak current that is substantially above the layer fuse peak current such that one or more predetermined layer fuses 135 may be electrically disconnected with a disconnection current across the respective core column fuses 110 without disconnecting the respective layer fuses 135. The layer fuse disconnection current is above the layer fuse peak current and below the core fuse peak current such that the layer fuse(s) 135 thermally disintegrate. Following the layer fusing, a core fuse disconnection current may be supplied across one or more predetermined core column fuses 110 via a number of layers 114, 118, 123 in parallel, such that the core fuse disconnection current is divided across a number of effected layer fuses 135. Consequently, this layer fuse sum peak current remains remains above the column fuse peak current despite the individual layer fuse peak currents of the effected layer fuses 135 is below the column fuse peak current.

Also part of the transistor pillar logic circuitry 100 may be a number of interconnect columns 166 that may be conductively connecting source, drain, and gate layers 114, 118, 123 of different transistor stacks 147 across interconnect fuses 165. The interconnect fuses 165 are similarly configured and operate similarly as the layer fuses 135. The interconnect columns 166 may feature interconnect fuses 166 that may be selectively disintegrated as is taught for the core column fuses 110. By selectively disintegrating the interconnect fuses 166, source, drain and/or gate layers 114, 118, 123 of different transistor stacks 147 may be combined. The same way, multiple gate layers 123 stacked within the third through portion 153 may be combined. This may be of advantage in cases where feasible layer thickness is substantially below a minimum through portion that may be required for a reliable gating function of the transistor as is well known in the art.

Figure 5:
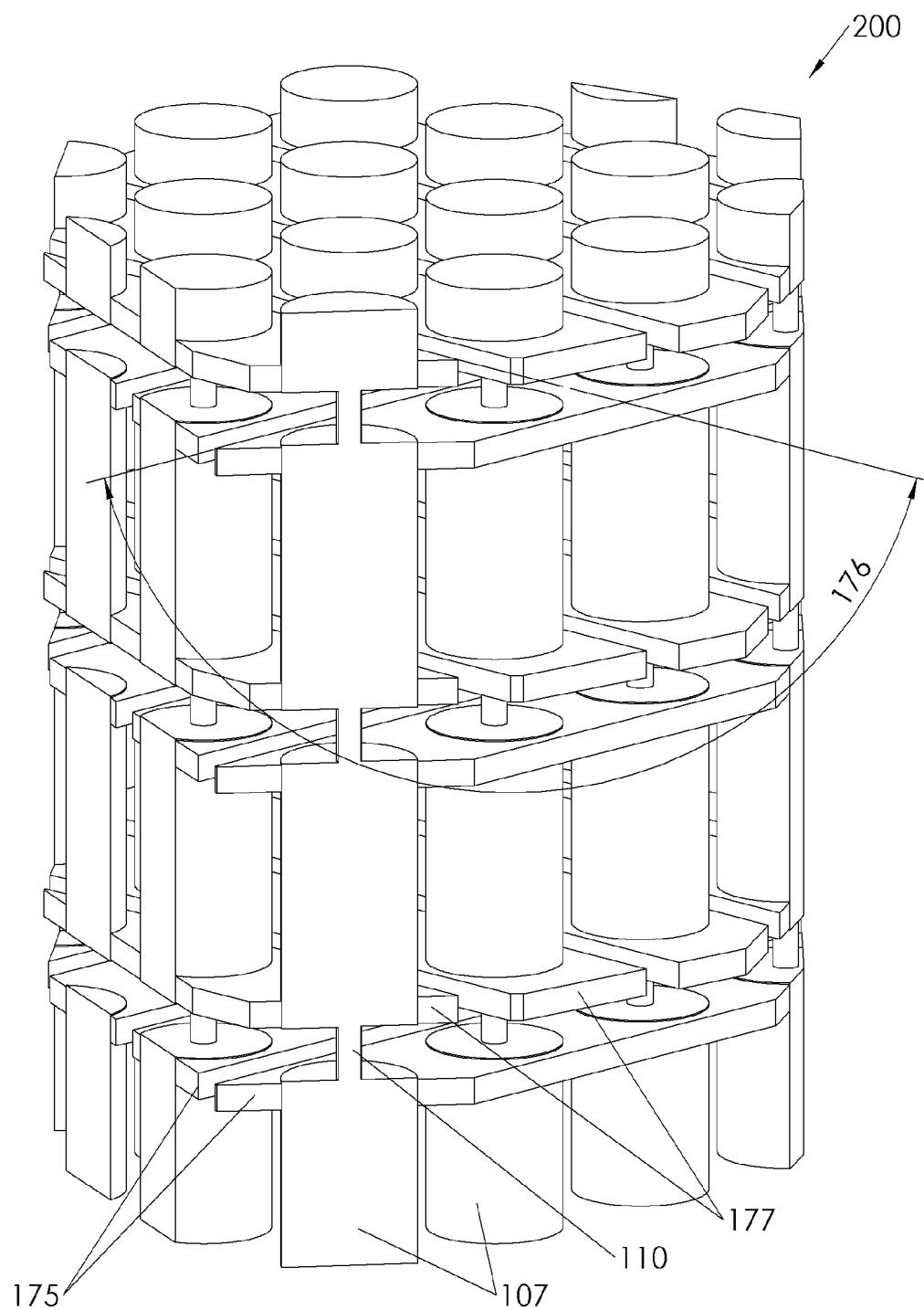
FIG. 5 is a second perspective view depicting a transistor core column array and angled stripe layers of a second embodiment of the invention.
Figure 6:
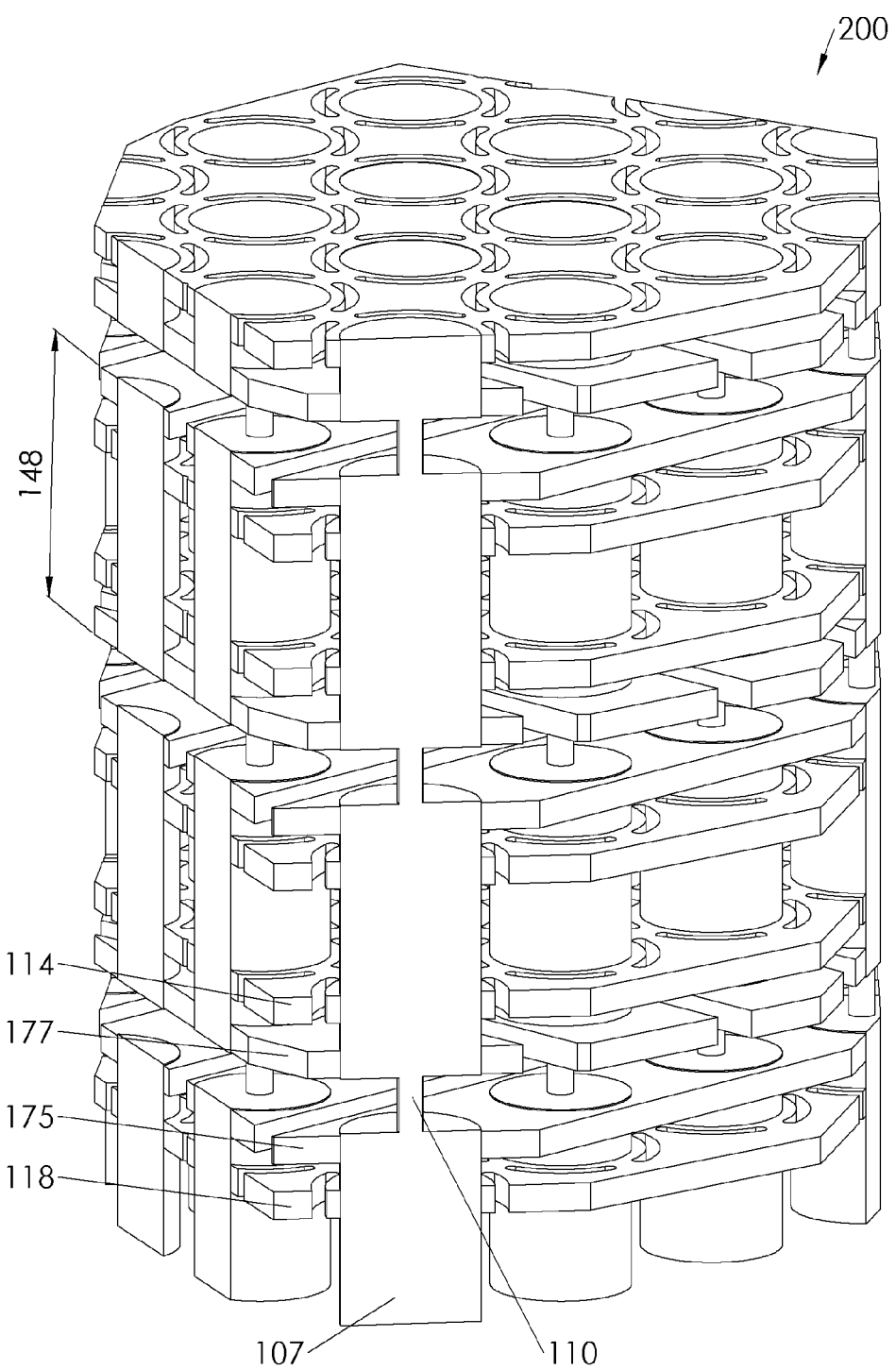
FIG. 6 is the second perspective view further depicting source and drain layer of the second embodiment of the invention.

In a second embodiment of the transistor pillar logic circuitry 200 depicted in FIGS. 5, 6, additional first and second conductive stripe layers 175, 177 are positioned immediately adjacent on both sides of the core column fuses 110. The stripe layers 175, 177 are preferably in between the source and drain layers 114, 118 and the core column fuses 110. The stripes of one of the first and second conductive stripe layers 175, 177 are preferably aligned with a first array direction of the core columns 107 and the stripes of one other of the first and second conductive stripe layers 175, 177 are preferably aligned with a second array direction of the core columns 107. That way, the core column fuse current may be directed across one ore more individual core column fuses 110 via one or more predetermined stripes of the first conductive stripe layer 175 and via one or more predetermined stripes of the second conductive stripe layer 177. Consequently, the stripes of one of the first and second conductive stripe layers 175, 177 are oriented in a stripe angle 176 with respect to the stripes of one other of the first and second conductive stripe layers 175, 177.

Figure 7:
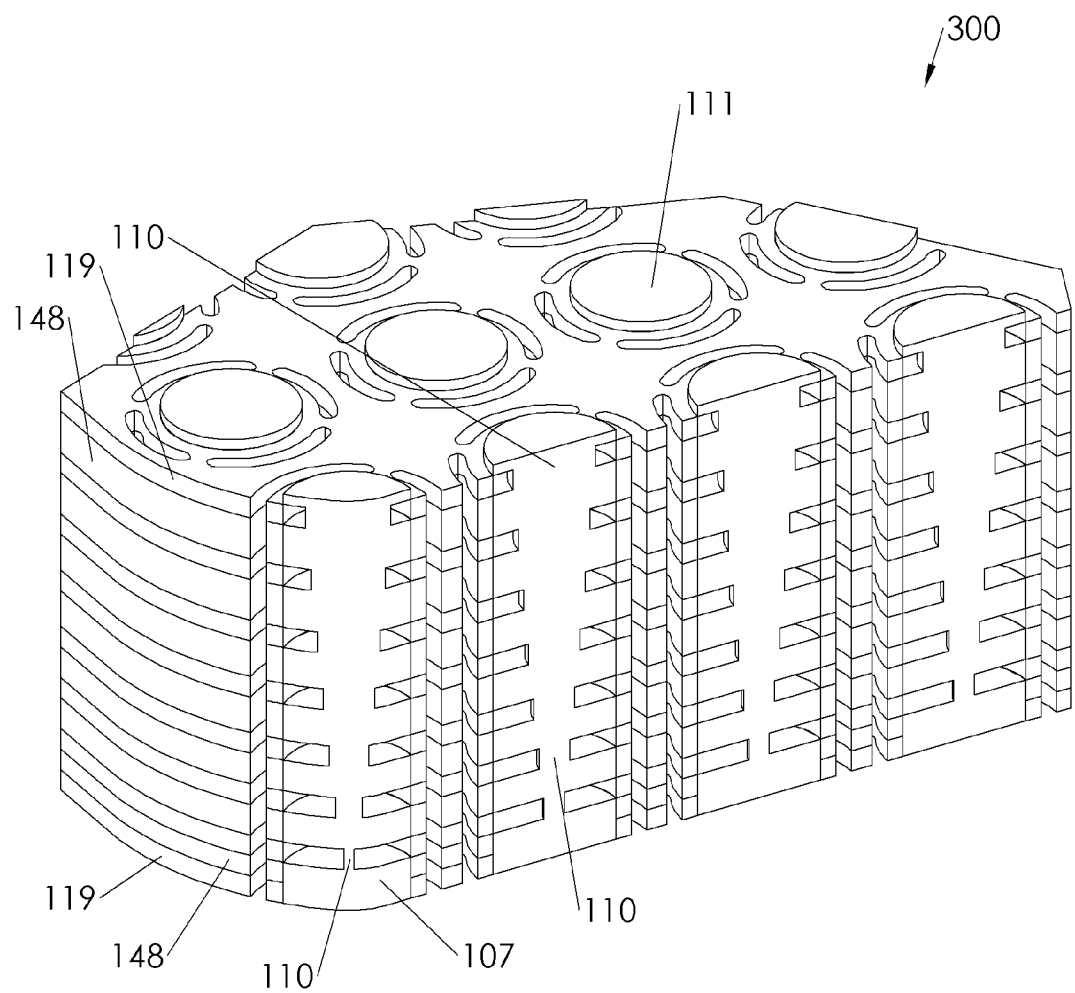
FIG. 7 is a third perspective view of a simplified third embodiment of the invention.

In a third embodiment of the invention depicted in FIG. 7, a number of core columns 107 feature multiple core column fuses 110 and column end terminals 111 that may be conductively accessed with conductors well known for integrated circuitry. The multiple core column fuses 110 are configured with column fuse peak currents that decrease at each core column fuse 110 further away from the respective column end terminal 111. Likewise, source, drain and gate layers 114, 118, 123 of individual transistor stack layers 148 may also be reduced in thickness in direction away from the column end terminals 111. That way, layer fuse peak currents may also decrease in direction away from the column end terminals 111. Modulating layer fuse disconnection current and core column fuse disconnection current may thereby additionally assist in selectively layer fusing and/or core column fusing at predetermined distance(s) from the column end terminals 111.

In the three embodiments, core column and layer fuse peak current may be predetermined by fabricating the core column fuses 110 and layer fuses 135 with predetermined cross sections. Fusing in context of the present invention means disintegrating a fuse such that no conductive path exists anymore across them. In the first embodiment of the invention, an original fabricated transistor pillar logic circuitry 100 may be fuse programmed by applying first a layer fuse disconnection or set current to predetermined layers preferably via individual stair step layer terminals 125, semiconductor and/or interconnect core columns 107, 166 and base substrate 103. Once the layer fuses 135, 165 are fused, the core column disconnection or set current is applied across the previously spared layer fuses and only respective column fuses 110, 165 are fused. In the first embodiment, fuse programming is mainly employed layer wise. In the second embodiment, the layer fusing within individual transistor stack layers 148 may be facilitated by dividing the flow of the layer fuse disconnection current in parallel across predetermined stripes of first and second stripe layers 175, 177 within a single transistor stack layer 148. Core fusing may be facilitated by directing the flow of the core fuse disconnection current in serial across predetermined stripes of first and second stripe layers 175, 177 on both sides of the respective core column fuses 110 and/or interconnect column fuses 165 and within adjacent transistor stack layers 148. In the third embodiment, layer and core fusing may be accomplished by directing layer and/or core fuse disconnection currents via predetermined individual column end terminals 111 of semiconductor core columns 107 and/or interconnect columns 166. In addition, selecting layer and/or core fuse disconnection currents at predetermined strength, layer and/or core fusing at different distances to the column end terminals 111 may be assisted. Functional and structural elements of the three embodiments may be combined as may be clear to anyone skilled in the art.

Accordingly, the scope of the invention described in the Figures and Specification above is set forth by the following claims and their legal equivalents:

What is claimed is:

1. A transistor pillar logic circuitry comprising a number of semiconductor core columns arrayed in a core column array, comprising a first array direction and a second array direction, wherein each core column includes:
   A. at least two transistor stacks, each transistor stack comprising:
      i. a first vertical through portion of said semiconductor core column, defining a transistor source;
      ii. a second vertical through portion of said semiconductor core column, defining a transistor drain, and
      iii. a third vertical through portion of said semiconductor core column, defining a transistor gate, and
   B. a core column fuse arranged vertically in between each of the transistor stacks, the transistor pillar logic circuitry further comprising:
   i. a source layer substantially conductively encompassing the first vertical through portion,
   ii. drain layer substantially conductively encompassing the second vertical through portion,
   iii. a gate layer substantially conductively encompassing the third vertical through portion,
   iv. a first conductive stripe layer in conductive connection with at least one core column immediately adjacent on one side of each core column fuse, wherein
   said first conductive stripe layer comprises at least one first conductive stripe that is in conductive connection with at least one of said number of core columns and that
   is aligned with said first array direction, and
   v. a second conductive stripe layer in conductive connection with at least one core column immediately adjacent on one other side of each core column fuse,
   wherein said second conductive stripe layer comprises at least one second
   conductive stripe that is in conductive connection with said at least one core column and that is aligned with said second array direction such that a core column fuse current is directed across said core column fuses via said first conductive stripe and said second conductive stripe.

2. The transistor pillar logic circuitry of claim 1, wherein at least one of said source layer, said drain layer and said gate layer comprises a layer fuse that is conductively connecting a column ring and a peripheral conductor both within said at least one of said source layer, said drain layer and said gate layer.

3. The transistor pillar logic circuitry of claim 2, wherein said layer fuse is radially located with respect to said semiconductor core column, extending between said column ring and said peripheral conductor.

4. The transistor pillar logic circuitry of claim 3, wherein a plurality of said layer fuses are circumferentially arrayed around said column ring.

5. The transistor pillar logic circuitry of claim 2, further comprising a venting slot vertically extending across said source layer, said drain layer and said gate layer in an offset to said semiconductor core column and adjacent said column ring and said layer fuse such that fumes evaporating from said layer fuse are vented off through said venting slot.

6. The transistor pillar logic circuitry of claim 1, wherein said core column fuse includes a core fuse peak current that is substantially above a layer fuse peak current such that said layer fuse can be electrically disconnected with a disconnection current across said core column fuse without disconnecting said core column fuse.

7. The transistor pillar logic circuitry of claim 1, further comprising at least one vertical interconnect column that is configured to be conductively connected to at least one of said source layer, said drain layer and said gate layer and at least one other of said source layer, said drain layer and said gate layer.

8. The transistor pillar logic circuitry of claim 1, further comprising at least one vertical interconnect column that is configured to be conductively connected vertically across a core column fuse to connect at least one of said source layer, said drain layer and said gate layer of one of said at least two transistor stacks with at least one of said source layer, said drain layer and said gate layer of one other of said at least two transistor stacks.

* * * * *